United States Patent [19]

Accuntius et al.

[11] Patent Number: 5,284,676
[45] Date of Patent: Feb. 8, 1994

[54] PYROLYTIC DEPOSITION IN A FLUIDIZED BED

[75] Inventors: James A. Accuntius, Georgetown; David S. Wilde, Austin, both of Tex.

[73] Assignee: Carbon Implants, Inc., Austin, Tex.

[21] Appl. No.: 793,588

[22] Filed: Nov. 18, 1991

Related U.S. Application Data

[63] Continuation-in-part of Ser. No. 569,087, Aug. 17, 1990, abandoned.

[51] Int. Cl.⁵ .............................................. B05D 7/00
[52] U.S. Cl. ........................................ 427/8; 427/213; 427/249; 427/255.6; 427/314
[58] Field of Search ................ 427/213, 8, 249, 255.6, 427/314

*Primary Examiner*—Bernard Pianalto
*Attorney, Agent, or Firm*—Fitch, Even, Tabin & Flannery

[57] ABSTRACT

Precise control of pyrocarbon being coated upon an object in a fluidized particle bed is achieved by monitoring the pressure difference between a region above the bed and a region in the lower portion of or just below the bed. Measurement of such pressure differential has been found to be truly representative of bed size in such a coater, and bed size is recognized to be a most important factor in achieving the desired characteristics of the substance being deposited. By adjusting bed size in response to changes in the pressure difference being monitored, a substantially constant bed size is readily achieved; alternatively, the pressure difference can be caused to gradually change in accord with a predetermined program. In either instance, adjustments are effected by adding additional particles to the bed or by changing the rate at which particles are withdrawn, and precise coating characteristics, e.g. thicknesses within very close tolerances, are achievable.

14 Claims, 1 Drawing Sheet

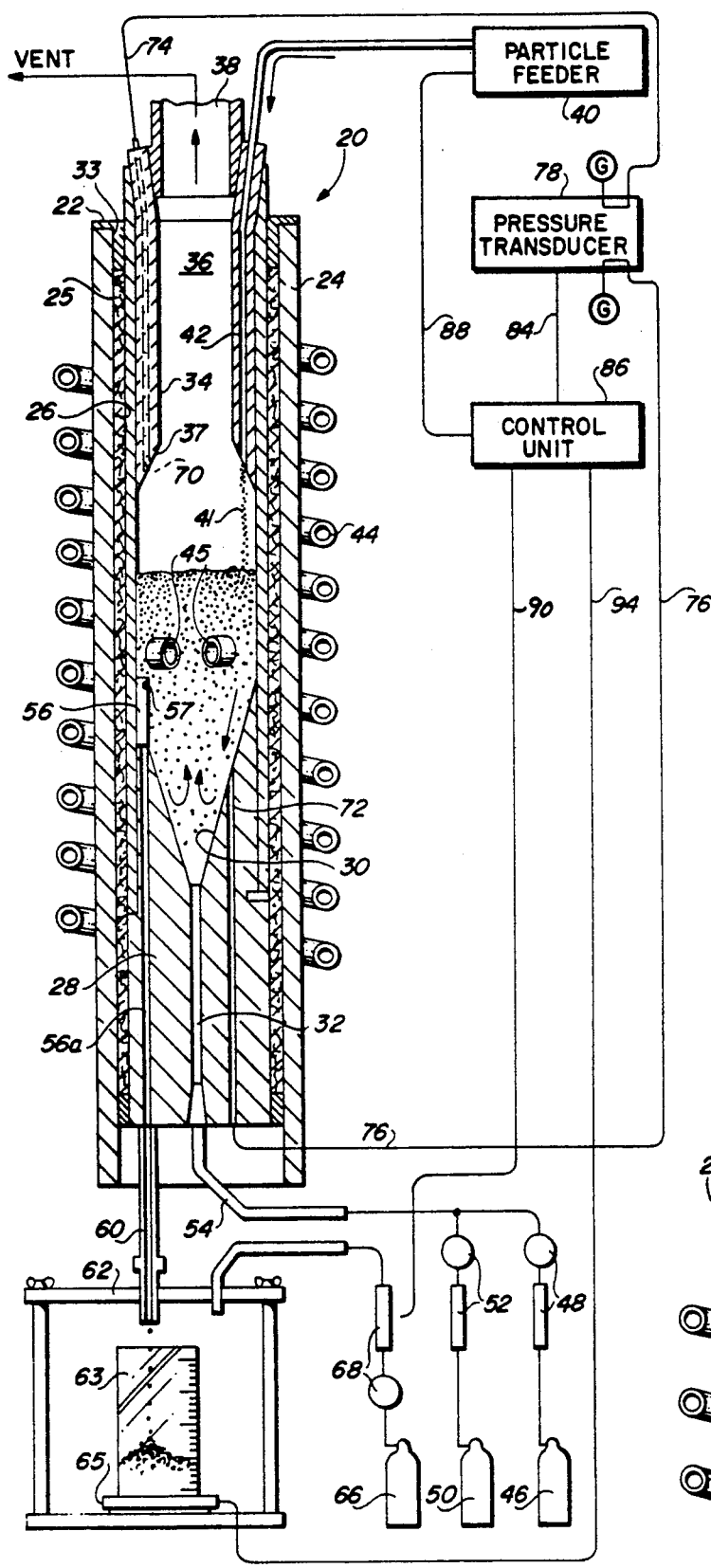
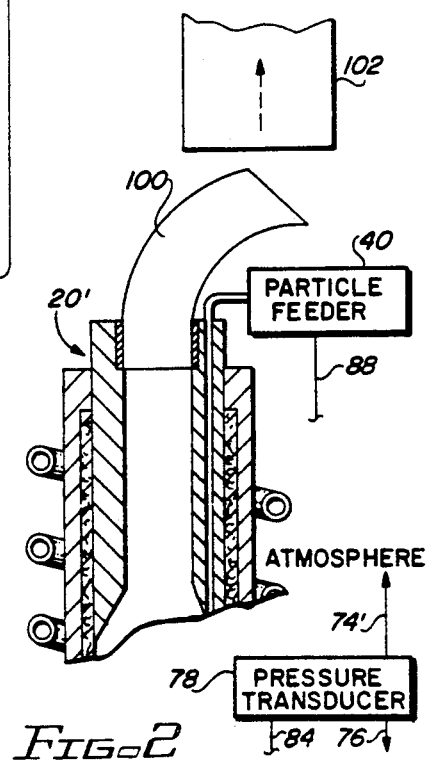
FIG-1
FIG-2

PYROLYTIC DEPOSITION IN A FLUIDIZED BED

This application is a continuation-in-part of U.S. application Ser. No. 569,087, filed Aug. 17, 1990, now abandoned.

FIELD OF INVENTION

This application relates to the deposition of a substance, such as pyrolytic carbon, onto a substrate being levitated in a fluidized bed of particles, and it more specifically relates to methods and apparatus for very carefully controlling pyrolytic deposition, particularly in instances where the density of the substance being deposited is less than the density of the particles that make up the particulate bed that is being levitated.

BACKGROUND OF INVENTION

Pyrolytic carbon or pyrocarbon has long been deposited by the thermal decomposition of a gaseous or vaporized hydrocarbon, or some other carbonaceous substance in vaporous form, in the presence of a substrate on which the deposition occurs. It has also been known for a number of years that the character of the pyrocarbon deposited is highly influenced by the amount of surface area available for deposition within a fluidized bed of a certain unit volume and that accordingly the characteristics of the pyrocarbon actually deposited can be desirably influenced by careful control of the bed size, as generally taught in U.S. Pat. No. 3,399,969 to Bokros, et al. This patent points out that the pyrocarbon coating of relatively large objects, such as objects having a dimension of about 5 millimeters or greater, in the presence of an ancillary bed of small particles (i.e. of a size measured in tens or hundreds of microns), is best controlled by controlling the available deposition surface area relative to the volume of the coating enclosure wherein the actual deposition is taking place.

In U.S. Pat. No. 3,977,896 to Bokros and Akins, an improved process was described and illustrated for depositing pyrolytic carbon coatings of substantial thickness which would have a very uniform crystallinity throughout the entire thickness of the pyrocarbon deposited. Such uniformity was achieved by maintaining the total deposition surface area within the coating enclosure relatively constant by adding particles of small size to the coater while coated particles (which have grown in size) are being removed from the enclosure at a controlled rate by regulating the rate of flow of an inert gas stream upward through a conduit through which the particles exit.

Subsequent to the issuance of the '896 patent, U.S. Pat. No. 4,546,012 issued in the name of Brooks which discloses an improved fluidized bed apparatus for coating such relatively large objects in association with a bed of particles being levitated, wherein a constant bed size is maintained from a volumetric standpoint by employing a weir tube having a spillover entrance hole to define the maximum upper level of the fluidized bed by its location at a desired vertical level within the coating enclosure. Preferably the weir tube is closed at its top and has its spillover hole facing away from the centerline of the coating enclosure. Sufficient purge flow of inert gas upward through the tube is maintained so as to prevent any substantial quantity of dust from gravitating down the tube with the coated particles being withdrawn. U.S. Pat. No. 4,594,270 also issued in the name of Brooks and shows an apparatus for removing particles from a desired level within such a fluidized bed wherein a larger object is being levitated and coated by pyrolytic decomposition. This patent teaches the employment of a vertically slidable sampling tube, preferably controlled from the exterior of the furnace, which can be located so as to have its opening at a desired vertical level from which the sample is to be withdrawn. Flow of inert gas through the sampling tube is controlled so as to selectively allow particles to be withdrawn from the bed when the tube is at the desired vertical level.

Although the foregoing patents disclose acceptable processes for controlling pyrolytic deposition within a fluidized bed system, it is extremely difficult, if not impossible, to determine the actual size of the bed surface area at any given moment, and as coating processes become more sophisticated, there is a desire to be able to even more precisely control the characteristics of the pyrocarbon being deposited. As a result, more improved methods of control have been sought.

SUMMARY OF THE INVENTION

It has been found that the deposition of pyrocarbon or a similar substance onto a substrate being levitated in a fluidized bed of particles can be very precisely controlled in a relatively simple manner by measuring a variable which has been discovered to be truly representative of bed size, namely by monitoring the difference between (a) the pressure at a predetermined location within or just below the fluidized bed and (b) the pressure at a location above the bed. If there is substantial soot formation in the fluidized bed coater, the pressure is preferably measured at a location which is below the level where soot forms, or exterior thereof as described hereinafter. After determining the precise difference between the pressures monitored at these two locations, the surface area within the bed is appropriately changed in response to such differences in the monitored pressures. Such a minor change in bed size is effected either by changing the rate at which particles are being withdrawn from the bed or the rate at which particles are being fed into the bed, or both. As a result, the characteristics of the pyrocarbon or other substance being deposited can be controlled in a very precise manner, for example, to either maintain extreme uniformity of crystallinity of the pyrocarbon being deposited or to change the character of the pyrocarbon being deposited in a programmed manner. For instance, pyrocarbon of a first character might be deposited at the beginning of a coating operation, and pyrocarbon of a different character deposited during a subsequent part of such coating operation.

BRIEF DESCRIPTION OF THE DRAWINGS

FIG. 1 is a schematic view, partially in section, of a fluidized bed apparatus for depositing pyrolytic coatings upon objects being levitated in association with a bed of particles embodying various features of the present invention, together with associated control mechanism for the operation thereof.

FIG. 2 is a fragmentary schematic view showing an alternative embodiment of a portion of the apparatus illustrated in FIG. 1.

DETAILED DESCRIPTION OF THE PREFERRED EMBODIMENTS

Illustrated in FIG. 1 is a suitable fluidized bed coating apparatus 20 which includes a furnace 22 having an outer cylindrical shell 24 within which the coating enclosure is located. The coating enclosure is generally separated from the cylindrical outer shell of the furnace by a layer of insulation 25 and is defined generally by a thin sleeve or tube 26 in combination with a lower insert 28. The lower insert 28 mates with the bottom end of the thin tube 26 and provides the coating enclosure with a conical bottom surface 30; it includes a central passageway 32 that extends vertically upward therethrough and is preferably coaxial with the thin tube 26 which is of circular cross-section. Although there should be no size limitations on such coaters, of general interest are coaters having tubes 26 not greater than about a foot in diameter and particularly those having an interior diameter of about 6 inches or less. The levitating atmosphere flows upward through this passageway 32 to enter the coating enclosure.

The upper end of the furnace tube 24 includes an annular spacer 33 which centers the coating tube 26 therewithin, and an exit passageway 36 from the coating enclosure is defined by an upper insert 34 which extends downward into the furnace and narrows the outlet opening somewhat, which insert has a frustoconical lower surface 37. The hot levitating and coating gases leaving the fluidized bed coater pass through this upper exit passageway 36 and flow via a suitable conduit 38 leading to an appropriate vent.

A particle feeding device 40 is mounted generally above the fluidized bed coater 20 and is designed to feed minute particles 41 into the coating enclosure at a desired rate. The particles from the feeder 40 enter the coater through an entrance conduit 42 which extends downward through the wall of the upper insert 34 terminating at the frustoconical surface 37. A suitable induction or alternating current heating device 44 is provided, as well known in this art, and is disposed in surrounding relationship to the furnace tube 24 in order to heat the active deposition region of the coating enclosure, together with the small particles and the objects being levitated, to bring them to the desired deposition temperature for coating.

The coating operation is carried out by establishing a levitated bed of minute particles, submillimeter in size, which is maintained in the lower region of the coating enclosure; this bed extends, as illustrated, into the conical region defined by the upper end surface 30 of the lower insert. Once the bed is established, one or more objects 45 to be coated, such as annular valve bodies or occluders for prosthetic heart valves, are appropriately loaded into the bed through the upper exit passageway 36; once in the bed, they will be supported among the fluidized particles by the upwardly flowing gaseous stream. The bed of particles and the objects to be coated are then appropriately heated to raise their temperature to the desired coating temperature by applying an appropriate amount of electrical power to the heating unit 44. The temperature within the coating enclosure is appropriately monitored and controlled as is well known in this art, using either electrical (e.g. thermocouple) or optical temperature-measuring devices, the latter of which could be effected through a viewing port (not shown).

The upwardly flowing gas stream, during the time of coating, is made up of a mixture of an inert fluidizing gas plus a carbonaceous substance, such as a gaseous hydrocarbon, for example methane, ethane, propane, butane, acetylene, propylene or mixtures thereof, or some other suitable carbon-containing substance that is either gaseous or easily vaporizable, as is well known in this art. If it is desired that the substance being deposited is not 100 percent pyrocarbon but instead is an alloy, for example, of silicon carbide and pyrocarbon, a desired amount of an appropriate source of silicon, such as methyltrichlorosilane, is also included in the levitating-coating gas mixture. Illustrated in FIGURE 1 is a source of hydrocarbon 46 which is provided with a flow-regulating valve arrangement 48 alongside a source 50 of inert gas, for example argon, helium or nitrogen which is likewise equipped with a suitable flow-regulating valve arrangement 52. These two gas sources flow into a common line 54 which leads to the vertical passageway 32 in the lower insert 28.

The total flow of levitating-coating gas upward through the coating enclosure is regulated so that the fluidized bed occupies a region generally near the bottom portion of the tube 26, as depicted in FIG. 1. The upward flow of the gaseous stream through the central passageway causes a generally toroidal flow pattern to be established within-the lower region of the fluidized bed, which in the illustrated arrangement is partially defined by the conical surface 30 of the insert 28, with the minute particles traveling upward in the central region and then downward generally along the outer perimeter of the toroidal flow pattern. However, other arrangements might be used, such as flat-bottomed coating enclosures where the gas mixture enters via a porous frit or a drilled plate, as generally known in this art.

The particles may be chosen so as to have a density greater than the density of the substance being deposited in the bed. When pyrocarbon is to be deposited, or pyrocarbon alloyed with a minor amount of silicon carbide, particles of materials having a density of at least about 3 grams/cm$^3$, and preferably from about 4 to about 5.5 grams/cm$^3$, are used. Examples include refractory oxides, such as alumina, alumina-silica (e.g. mullite) and dense zirconium oxide, e.g. ZrO$_2$ having a density greater than about 5 grams per cm$^3$ or a mullite of a density of about 3.2 grams per cm$^3$. As such particles are coated, the overall density of the composite or coated particles will gradually become less as they increase in size. In general, the smaller uncoated particles tend to sink to the lower portion of the bed, while the less dense composite particles having a greater coating thickness are generally levitated higher and reside in the upper portion of the bed. The particles employed should be about 1,000 microns (Mm) or less in size. Preferably, the particles added during the coating run should have an average size not greater than about 400 microns and may be made up of particles between 300 and 425 microns, and the average size of the particles withdrawn over the coating run should be greater than about 500 μm.

To remove particles from the bed, an exit conduit 56 is provided having an opening of suitable diameter in its upper end. The conduit 56 can extend through the entire lower insert 28, or it can be shorter in length and be received in a coaxial counterbore provided at the upper end of a drilled passageway 56$a$, so as to protrude from the conical surface 30 of the insert. The exit conduit 56 is preferably capped at its upper end and has an exit hole 57 in its sidewall. The conduit 56 may be proportioned so that its upper end terminates within the vertical region defined by the conical surface 30, and preferably, the conduit 56 protrudes from the conical surface 30 a maximum vertical distance of less than about 1 inch for a coater having an interior diameter of about 4 inches or less. The exit conduit 56, which extends into the coating region, is formed of a suitable refractory material, such as graphite or mullite.

Particles from the fluidized bed which enter the conduit 56 through the hole 57 fall downward by gravity to a discharge conduit 60 leading to a collection chamber 62 where they are received in a graduated cylinder 63 or the like so that the total amount and/or volume of particles removed can be determined at any time either visually or through the use of a load cell 65. The collection chamber 62 is pressurized with inert gas from a suitable source 66 which is precisely controlled through the use of a flow-regulating valve arrangement 68 that is remotely controlled, as discussed in more detail hereinafter. The flow of inert gas out of the pressurized collection chamber upward through discharge tube 60 and the exit conduit 56 not only serves as a purge flow to prevent substantial quantities of dust from falling into the collection chamber, but it also serves to precisely regulate the rate of removal of particles from the fluidized bed, as more particularly discussed in U.S. Pat. No. 3,977,896. By increasing the gas pressure within the collection chamber 62, the rate of upward flow of inert gas will increase, with a resultant decrease in the rate, or total cessation, of withdrawal of particles from the bed. Decrease of gas pressure, continuously or periodically, increases withdrawal.

It has been found that the size of the fluidized particle bed within a coating enclosure in the region where the coating deposition is occurring may be the most important parameter in precisely controlling the character of the pyrocarbon being deposited. It has now been found that measurement of the change in the pressure difference ($\Delta P$) across the fluidized bed is an effective way of sensing even small changes in bed size. As a result, it has been found that, by monitoring the pressure difference across the bed, i.e. between a point at a lower region in the bed or just below the bed and a point above the bed, and responding to changes from desired values that are thereby detected, precise control can be achieved throughout a coating run. It has also been found that one way such monitoring can be accomplished is by employing a pair of dedicated, pressure-sensing ports in the region of the coating enclosure. In the illustrated embodiment, an upper pressure sensing port 70 is provided in the form of an elongated passageway which extends through the upper insert 34. Similarly, a lower pressure-sensing port 72 is provided via a long passageway in the lower insert 28. The lower port 72 is preferably located in the lower one-half of the volumetric region of the bed or below the bed, and it is more preferably located in the lower 25% of the volume of the bed. The upper port 70 and the lower port 72 are respectively connected via tubing 74, 76 to a pressure transducer 78 for measuring the pressure at these ports and comparing the two pressures measured to determine the difference between the two measured pressures. If desired, optional, visually-readable gauges can be included. Although a pressure transducer 78 is preferred, other suitable pressure-measuring devices, such as manometers, can alternatively be used. To keep the ports and the tubing clear of dust, carbonaceous material and/or particles, an appropriate slow purge flow of inert gas (not shown) is maintained through both port systems. The purge flows for each of the ports 70, 72 are constant and appropriately injected into the tubings 74, 76. An initial measurement is taken at the beginning of each coating run that takes the respective purge flow into consideration, and it serves as a reference point for that coating run.

A signal from the pressure transducer 78 is sent through a suitable line 84 to a control unit 86. The control unit 86 compares the signal being received with the values programmed into its memory to see if the desired pattern is being maintained, and if it is not, the control unit 86 instigates appropriate adjustments. Adjustments in the bed size are made by changing the rate at which particles are fed to the bed, or by changing the rate of removal of particles from the bed, or both. Accordingly, the control unit 86 is connected by a suitable line 88 through which a signal, e.g. electric, pneumatic, etc., is transmitted to the particle feeder 40 and by a similar line 90 leading to the control valve 68, which determines the rate of flow of inert gas upward through the particle exit conduit 56, 60. It is convenient to set the particle feeder to feed particles of a desired size into the coater 20 at a substantially constant rate, in which case, changes in bed size in response to the pressure differences monitored are preferably carried out by either increasing or decreasing the rate of withdrawal of particles from the bed.

In order to assure that the particles are being removed from the fluidized bed in the amount desired, the load cell 65 is preferably provided under the beaker 63 into which the particles fall. The load cell is connected by suitable line 94 to the control unit 86 and provides a signal which is indicative of the total weight of a beaker and particles. The control unit is capable of comparing the weight signals versus time and thereby determining the precise amounts of particles removed during each desired interval of time, for example, each minute or fraction of a minute. The employment of the load cell 65 allows precise determination whether modulation of the rate of flow of nitrogen, for example for short periods of defined length, upward through the particle removal conduit is achieving the desired effect. As a result it permits prompt adjustments to be made in the nitrogen pressure or in the frequency or lengths of the periods of lower $N_2$ flow rate, to fine-tune the removal of particles to that desired in order to maintain the precise difference between the monitored pressures as programmed for a particular time period in a coating run.

Any suitable electronic controller can be used, such as one commercially available from Inotek/Analog Devices, or a UDC 9000 Multi-Pro from Honeywell, or an IMB 286 computer and Control E.G. software. The control unit 86 is preferably capable of being programmed so as to establish different bed conditions over the length of a coating run, and such programmable features are available in commercial controllers. The unit preferably includes a minicomputer that can be programmed so as to, for example, employ a relatively large bed size at an early stage of a particular coating run to cause pyrocarbon to be deposited more slowly and thereby better cover inside corners; thereafter, the program may gradually decrease the bed size during a later stage in the run, so as to increase the rate of pyrocarbon deposition. If desired, additional changes can be made so as to gradually increase bed size near the end of a coating run to compensate for the growing mass of the objects being coated or to, for some reason, alter the physical characteristics of the coating being deposited on a particular substrate. For example, a different crystalline character of pyrocarbon may be desired at different regions throughout the depth of the coating, or perhaps even alternating crystalline characteristics near the ultimate exterior surface may be desired for a particular purpose. Moreover, by monitoring the pressure difference and making such changes in bed size as necessary, and optionally utilizing the input from the load cell 92 to assure the desired rate of withdrawal is being achieved, the rate at which pyrocarbon or some other substance is deposited can be very carefully controlled, and as a result of such control, the precise thickness of the coating that has been deposited at any point during the coating run can be determined. In this manner, it is possible to repeatedly coat particular objects with coatings of a carefully controlled, desired thickness to a precision of within about 1 mil (0.001 inch). This is a particularly valuable advantage of the invention when coating parts, such as parts for prosthetic heart valves, wherein precision in achieving tolerances is extremely important and thus commercially very valuable.

Should a fluidized bed grow too small, it will no longer properly levitate the objects being coated, and there is danger that the entire bed will collapse, interrupting the coating process and likely resulting in a need to reject the objects being coated from the standpoint of quality control. By employing the present invention, such a potential collapse of a fluidized bed can be positively prevented because any tendency of a fluidized bed to grow too small will be promptly detected as soon as it begins, and countermeasures can be automatically promptly taken by the control unit 86 so as to return the bed to its desired size, usually by slowing the rate of removal of particles from the bed so that its size will gradually increase until the desired bed size is reestablished. On the other hand, if a bed were to grow excessively large, not only would the characteristics of the pyrocarbon being deposited undesirably change, but the rate of deposition would slow, and the result would be that, after a predetermined time of deposition, a thinner coating than expected would have been deposited upon the objects being coated, with the pyrocarbon deposited being generally less in hardness than that deposited upon the parts in a smaller bed. Accordingly, it can be just as important to prevent a bed from growing oversize, and the invention also positively prevents this occurrence, e.g., by having the control unit 86 increase the rate of removal of particles from the bed should it be determined that the bed size is undesirably increasing.

Although a pressure transducer 78 is the preferred device for monitoring the pressure above the bed and either just below or in a lower region of the bed, other suitable pressure sensing devices can be employed. For example, a water manometer can be employed in order to directly measure the pressure difference between the 2 ports 70 and 72, or separate manometers or other precise barometric-type apparatus can be used to individually measure the pressures and thereafter compare the results measured.

Illustrated in FIG. 2 is an alternative embodiment of apparatus 201 wherein the pressure-measurement upper passageway 70 shown in FIG. 1 is eliminated and a short exhaust stack 100 discharges the inert gas and pyrolysis stream products to a suitable location, e.g., terminating just below the entrance to an exhaust vent tube 102 through which a continuous exhaust flow of the atmosphere is maintained from the building or room wherein the apparatus is located. As can be seen, there is a gap of from about 1 to 6 inches between the termination of the exhaust stack 100 from the coater 20' and the entrance end of the exhaust vent tube 102. As a result, and because of the relatively wide exhaust stack, e.g. about 2 inches I.D., the pressure at the region above the fluidized bed within the coater is essentially atmospheric pressure. Accordingly, it has been found to be satisfactory to have the pressure transducer 78 simply monitor atmospheric pressure outside the coating apparatus 20', instead of monitoring the pressure just above the particle region of the bed in the enclosure because under these circumstances the pressure therein is essentially atmospheric. Accordingly, it has been found that by simply monitoring atmospheric pressure through the conduit 74' and comparing it with the pressure in the lower region of the bed monitored via the conduit 76 and feeding a signal representative of the difference between these two values to the control unit via the line 84 is an adequate alternative way of using these measurements to control the bed size and thereby precisely obtain the coating characteristics and thicknesses desired in a pyrolytic deposition process.

As an example of operation of a fluidized bed coating apparatus embodying various features of the invention, a fluidizing flow of an inert gas, such as nitrogen, is established upward through the coater 20 by opening the valve 52 and setting it to supply nitrogen from the source 50, which may be a pressurized tank or the like. A suitable charge of particles is then added to the coater, through the upper end, to create a fluidized bed. For example, in a coater having an internal coating enclosure diameter of about 3½ inches, one may begin with a charge of about 250 to 500 grams of pyrocarbon-coated zirconium dioxide particles having sizes greater than about 325 microns but less than about 700 microns. The particles of this initial bed are pyrocarbon-coated versions of the uncoated zirconia particles that will subsequently be fed into the bed during coating, having a density of about 5.37 grams per cc and a size ranging from about 300 microns to about 425 microns (with an average size of about 360 microns), which uncoated particles are loaded into the particle feeder 40. For a typical coating operation in a coater of about this size, about 20 to 40 orifice rings are added to the bed; such rings, when coated, will serve as valve bodies for prosthetic heart valves. Exemplary orifice rings generally have the form of short tubes, having a height of about 0.7 cm., an I.D. of about 1.5 to 2.5 cm. and an O.D. of about 1.6 to 2.6 cm. U.S. Pat. Nos. 4,822,353 and 4,863,467 show generally representative heart valves using valve bodies of this general type.

The apparatus is then brought up to its operating temperature of between about 1200° C. and 2000° C. so as to uniformly heat the particles and the objects to a desired temperature using the induction heating apparatus 44. Typically, the temperature is maintained at about 1320° C. During this warmup period, a sufficient flow of nitrogen is maintained upward through the conduit 56, which has an entrance aperture or hole 57 in the form of a 3/16 inch circle to prevent particle withdrawal, and a similar purge flow rate of about 4 liters per minute of nitrogen is maintained through the lower pressure port 72 so as to prevent particles from entering this port. In the coating apparatus of FIG. 1, the exit conduit 56 is located so that its inlet aperture 57 is located about 0.4 inch below the top edge of the conical surface 30 of the lower insert 28, wherein it is in about the middle of the bed, and it may be oriented so that the aperture 57 faces generally inward, e.g. at an angle of about 45° from a line through the centerline of the enclosure. The bed itself occupies a volume of about 17 cubic inches within the coating enclosure, and the conical surface of the lower insert has a vertical height of about 5 inches. In the illustrated embodiment, the port 72 is located at a level of about 2.5 inches above the bottom of the bed where the total depth of the bed is about 4.0 inches; however, it is located in the lower one-half of the volume of the bed because of the partially frustoconical configuration thereof.

When a coating run is ready to begin, the valve 48 is opened, and flow of a suitable coating gas, such as propane, is added to the fluidizing gas that is already flowing through the line 54 and the central passageway 32. In order to provide some alloying of the pyrocarbon being deposited with silicon carbide, methyltrichlorosilane is preferably added to the gas stream as is well known in this art. The flow rate of the inert gas is adjusted, if needed, so that the flow of the fluidizing-coating gas mixture upward through the coating enclosure, measured at standard temperature and pressure, is about 13 liters/minute nitrogen, about 7 liters/minute propane and about 1 liter/minute methyltrichlorosilane vapor. As soon as the coating run begins, the feeder 40 is caused to feed uncoated zirconia particles into the apparatus at the rate of about 2 grams per minute via the entrance passageway 42 through which they fall into and become a part of the fluidized bed. Because of their greater density, the small uncoated particles quickly gravitate to a lower level in the bed. A purge flow of about 4 liters of nitrogen per minute is also maintained through the entrance passageway, flowing along with the falling zirconia particles, and a purge flow of about 1 liter of nitrogen per minute is maintained through the line 74 leading to the upper pressure sensing port 70.

The pressure difference between the lower port 72 and the upper port 70 is monitored throughout the coating run by a pressure transducer 78 (e.g. a commercially available Sensotec Model Z or a SETRA Model C239). An output signal from the transducer representative of the difference in measured pressures is transmitted to the electronic controller 86, and it is compared, for example, each 15 seconds, with a program that is representative of the desired bed size. The control unit 86 causes appropriate adjustments to be made in the rate of removal of particles through the exit conduit 56 so as to cause this pressure difference to follow a predetermined path for an extended period of time which constitutes the coating run. Initially the flow of nitrogen upward from the chamber 62 through the withdrawal conduit, which is about ¼ inch in internal diameter, is maintained at, e.g. about 4 liters per minute, and such flow initially prevents any substantial withdrawal of particles. Generally, the larger the particles are which make up a bed, the smaller will be the overall bed surface area for a particle charge of a given weight. Accordingly, it is desirable to remove larger particles from the bed and constantly replace them with smaller uncoated particles that are being continuously added. Moreover, if the total bed surface area decreases significantly, the coating rate will increase and can result in the production of coatings having a significant amount of entrapped soot that are more difficult to polish; thus, it is also important to avoid too small a bed. The flow of $N_2$ upward through the conduit 56 and out through particle removal port 57, which is located in the sidewall of the conduit that is closed at its top, is then begun to be modulated by the control unit 86, e.g. by periodically decreasing flow rate for short time intervals measured in seconds, to effect a removal rate of about 6 to 8 grams of particles per minute. Feedback from the load cell 65 allows the control unit to make fine-tuning adjustments, e.g. by changing the length and/or frequency of the intervals.

The exemplary coating operation is carried out for about 180 minutes under conditions so as to initially maintain a pressure difference equal to about 4.0 inches of $H_2O$ during about the first 60 minutes of the run and then to very gradually decrease the pressure difference at a uniform rate over a second period of about 60 minutes until it is equal to about 3.0 inches, at which it is thereafter maintained. The change in pressure difference is achieved by effecting a decrease in bed size and results in an increase in the rate of deposition. At the conclusion of the coating run and cool-down, the coated articles are examined and the SiC-alloyed pyrocarbon is found to be of high quality and to have a precise uniform thickness of substantially 0.010 inch, having a tolerance within about 0.001 inch of the desired value.

The coating operation just described is repeated with a coater having a short exhaust stack attached to the upper end of the coater that leads toward an exhaust vent conduit through which the atmosphere from within the plant is exhausted at a rate of about 150 cubic feet per minute. There is a gap of about 3 inches between the entrance end of the exhaust conduit and the discharge end of the exhaust stack from the coater which stack has an interior diameter of about 2 inches. For purposes of this coating run, the pressure port provided by the passageway 70 is not utilized; instead, the atmospheric pressure just outside the coater is measured by the pressure transducer 78 and compared with the pressure at the same lower location within the bed, which is sensed through the port 72 and the line 76 as before. This information is similarly conveyed to the control unit through the line 84. The same coating operation is carried out as described hereinbefore, and the silicon-carbide-pyrocarbon coated articles are found to be of equally high quality following examination and to likewise have a precise uniform coating thickness within about 0.001 inch of the desired specification. Accordingly, monitoring the atmospheric pressure immediately outside the coater, as opposed to monitoring the pressure within the enclosure and just above the bed, results in satisfactory performance and in also obtaining coatings well within desired tolerances.

Very generally, methods and apparatus are provided which allow the very precise control of the deposition of a substance, such as pyrocarbon, onto a substrate being levitated in a fluidized bed of particles. Through the mechanism of monitoring the pressure difference between the region above the bed, which in many instances will be at substantially atmospheric pressure, and the region in the lower 25 percent of the bed volume (or just below), an extremely accurate measure of the bed size is obtained. This measure is then used as input to a control unit which is designed to make changes as necessary so as to achieve and maintain a preselected substantially constant bed size within the coating enclosure, or if desired, to carry out a preselected program of varying bed size in accordance with a predetermined program throughout the duration of a coating run.

Although the invention has been described with regard to certain preferred embodiments, it should be understood that various changes and modifications as would be obvious to one having the ordinary skill in this art can be made without departing from the scope of the invention which is defined solely by the claims appended hereto. For example, although the description has dealt with the deposition of pyrocarbon or silicon carbide alloyed pyrocarbon, other carbide alloying materials can be used, for example, zirconium carbide or tungsten carbide, or other substances could be deposited from a vaporous atmosphere, e.g. 100 percent SiC.

Particular features of the invention are emphasized in the claims which follow.

What is claimed is:

1. A method of carefully controlling the deposition of a substance onto a substrate while being levitated in a fluidized bed of particles, said deposition being carried out in an enclosure through which a gaseous atmosphere is caused to flow upward, which method comprises establishing a bed of particles in fluidized condition in said enclosure with at least one substrate to be coated being levitated within said fluidized bed, said levitation being effected by the upward flow of said gaseous atmosphere, heating said particles and said substrate to a desired temperature and including a pyrolytically decomposable component within said gaseous atmosphere such that pyrolysis of said component occurs to cause the desired pyrolytic substance to be deposited upon said substrate and upon said particles, both of which are being levitated, withdrawing particles from said bed in a controlled manner, adding feed particles to said bed in a controlled manner, which feed particles have an average size that is less than the average size of the particles being withdrawn, monitoring the pressure at a predetermined location within or below said bed and the pressure above said bed to determine the difference in pressure therebetween, and changing either the rate at which particles are withdrawn from said bed or the rate at which particles are fed to said bed or both in response to said determined pressure difference so as to precisely regulate deposition over an extended period of time and thereby produce a precise coating upon said substrate being coated.

2. A method according to claim 1 wherein said gaseous atmosphere component comprises a hydrocarbon which decomposes to deposit pyrocarbon.

3. A method according to claim 2 wherein said gaseous atmosphere also includes a major portion of an inert gas and a minor portion of an organic silicon compound, which compound decomposes at said desired temperature to deposit silicon carbide alloyed with said pyrocarbon.

4. A method according to claim 3 wherein said pressure within said fluidized bed is measured at a vertical location within the lower one-half of said bed, based upon total volume of said bed.

5. A method according to claim 4 wherein said pressure within said bed is measured at a region within the lower 25 percent of the volume of said fluidized bed, and wherein said region where said measurement is made is generally frustoconical in shape.

6. A method according to claim 1 wherein particles are substantially continuously added to the bed at a substantially constant rate throughout said extended period of time of coating said substrate.

7. A method according to claim 6 wherein the rate at which particles are being withdrawn from said bed is altered in response to changes in said pressure differences being determined.

8. A method according to claim 7 wherein the rate of withdrawal of particles from said fluidized bed is controlled by changing the rate of flow of an inert gas stream that is caused to flow upward in opposition to the gravity flow of said particles being withdrawn.

9. A method according to claim 7 wherein said particles being added have an average size of not greater than about 400 microns and wherein the average size of said particles being withdrawn from said fluidized bed, measured over the course of the coating of said substrate, is greater than about 500 microns.

10. A method according to claim 1 wherein the density of said substance being deposited is less than the density of the particles that constitute said particle bed.

11. A method according to claim 10 wherein said particles being added are dense zirconium dioxide having a density greater than the density of said substance being deposited.

12. A method according to claim 11 wherein said bed of particles initially established is formed substantially entirely of pyrocarbon-coated zirconium dioxide particles.

13. A method according to claim 1 wherein said pressure in said bed is measured via a port through which inert gas is constantly flowed throughout said extended period of time and wherein said pressure is monitored above said bed at a location at the end of a passageway extending into said enclosure.

14. A method of carefully controlling the deposition of a pyrocarbon onto a substrate while it is being levitated along with a fluidized bed of particles, which method comprises establishing a bed of particles in fluidized condition in a coating zone along with at least one substrate to be coated, all of which are levitated by the upward flow of a gaseous atmosphere, heating said particles and said substrate to a desired pyrolysis temperature, a carbonaceous pyrolytically decomposable component being included within said gaseous atmosphere such that pyrolysis of said component occurs to cause pyrocarbon to be deposited upon said substrate and upon said particles, monitoring the pressure at a predetermined location within or below said bed and the pressure above said bed to determine the difference in pressure therebetween over an extended period of time, and adjusting the amount of particles within said bed in response to said determined pressure difference so as to precisely regulate deposition of pyrocarbon over said extended period of time and thereby produce a precise coating upon said substrate.

* * * * *